United States Patent [19]

Russo et al.

[11] Patent Number: 4,991,286
[45] Date of Patent: Feb. 12, 1991

[54] METHOD FOR REPLACING DEFECTIVE ELECTRONIC COMPONENTS

[75] Inventors: Alexander J. Russo, Cedar Park; Daniel M. Andrews; Gregory E. Pitts, both of Austin, all of Tex.

[73] Assignee: Microelectronics and Computer Technology Corporation, Austin, Tex.

[21] Appl. No.: 453,726

[22] Filed: Dec. 20, 1989

[51] Int. Cl.$^5$ ............................................... H05K 3/34
[52] U.S. Cl. .................................. 29/840; 29/402.08; 174/52.2; 357/80; 437/206
[58] Field of Search ............... 357/80; 29/840, 402.08; 174/52.2; 437/206

[56] References Cited

U.S. PATENT DOCUMENTS

| | | | |
|---|---|---|---|
| 3,735,911 | 5/1973 | Word | 29/402.08 X |
| 3,751,799 | 8/1973 | Reynolds | 29/402.08 X |
| 3,838,984 | 10/1974 | Crane et al. | 174/52.2 X |
| 3,969,813 | 7/1976 | Minetti et al. | |
| 4,012,832 | 3/1977 | Crane. | |
| 4,567,643 | 2/1986 | Droguet et al. | |
| 4,586,252 | 5/1986 | Faticanti | 29/762 |
| 4,776,509 | 10/1988 | Pitts et al. | 228/179 |
| 4,806,503 | 2/1989 | Yoshida et al. | 437/206 |

*Primary Examiner*—Carl E. Hall
*Assistant Examiner*—Carl J. Arbes
*Attorney, Agent, or Firm*—Fulbright & Jaworski

[57] ABSTRACT

A method of replacing a defective electronic component having a plurality of electrical leads bonded to electrical contacts on a support by cutting leads adjacent the bond site, rebonding the stubs to the contacts, replacing the defective component and bonding the leads of the replacement component to the electrical contacts. Preferably, the leads are cut simultaneously with the rebonding of the stubs. The leads may be bonded to the top of the stub or to the side of the stub. A bonding tool is provided for simultaneously cutting a lead and rebonding the resultant stub.

7 Claims, 1 Drawing Sheet

METHOD FOR REPLACING DEFECTIVE ELECTRONIC COMPONENTS

BACKGROUND OF THE INVENTION

The present invention is directed to a method of replacing a defective electronic component having a plurality of electrical leads which are bonded to electrical contacts of a support such as a single chip package, multi-chip substrates, printed circuit boards (PCBs), or tape-automated-bonded (TAB) tape carriers.

However, if the electrical component is defective, it must be replaced or it must be scrapped. In the case of a multi-chip substrate this requires scrapping the entire module which can be quite expensive. And in particular, certain hard electrical contact bonds, such as gold-to-gold thermocompression and thermosonic bonds have generally been considered unrepairable because of the inability to remelt these bonds without damaging the underlying support. Attempts to remove these bonds by pulling them loose can result in uneven stub lengths or damage to the bonding pad. U.S. Pat. Nos. 4,567,643 and 4,806,503 disclose various methods for replacing a defective electronic component with a replacement.

The present invention is directed to an improved method of replacing a defective electronic component and is also directed to a bonding tool which is useful in a thermocompression or thermosonic bonding machine for assisting in the method.

SUMMARY

The present invention is directed to a method of replacing a defective component having a plurality of electrical leads bonded to electrical contacts of a support. The method includes cutting the electrical leads adjacent the bonds of the leads to the contacts leaving a stub bonded to each contact, and rebonding the stub to the contact. The method further includes replacing the defective component with a replacement electronic component having electrical leads and bonding the electrical leads of the replacement component to the electrical contacts of the support.

A still further object of the present invention is wherein the step of cutting the lead is performed simultaneously with the step of rebonding the stub.

Still a further object is wherein the electrical leads of the replacement component are bonded to the tops of the stubs.

A further object of the present invention is wherein the electrical leads of the replacement component are bonded to the contacts adjacent the stubs.

Another feature of the present invention is wherein the cutting of the electrical lead is substantially, but not entirely, through the lead for avoiding damaging the underlying support.

In particular, the present invention is useful for repairing bonds between electrical leads and contacts wherein the bonds are a gold-to-gold bond. The present invention is also applicable to the electrical leads of a TAB tape having the outer ends bonded to the contacts.

Another object of the present invention is the provision of a bonding tool for use in a thermocompression or thermosonic single point bonding machine for cutting an electrical lead from an electrical contact and bonding the remaining lead stub to the contact. The bonding tool includes a tip having a flat contacting end with at least one recess therein and a downwardly directed cutting edge connected to the periphery of the end. Preferably, the cutting edge extends downwardly from the end a distance less than the thickness of the electrical leads.

Other and further objects, features and advantages will be apparent from the following description of presently preferred embodiments of the invention, given for the purpose of disclosure, and taken in conjunction with the accompanying drawing.

DESCRIPTION OF THE PREFERRED EMBODIMENT

Figure 1:
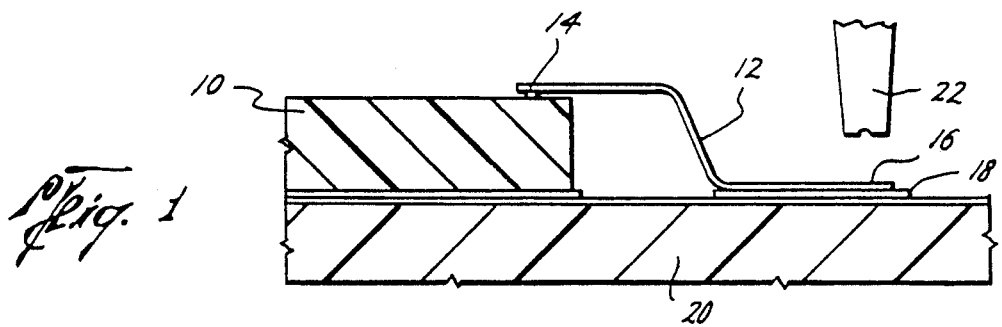
FIG. 1 is a fragmentary, elevational view, in cross-section, illustrating the bonding of one lead of an electronic component to an electrical contact of a support.

Referring now to the drawings, and particularly to FIG. 1, an electronic component 10 such as a chip, having a plurality of electrical leads 12, only one of which is shown for convenience, which may be TAB tape leads. The inner ends 14 of the leads 12 are bonded to the component 10 and the outer leads 16 are to be bonded to electrical contacts such as pads or bumps 18 on a support 20 which may be a substrate, a single chip package, a multi-chip substrate, a PCB, or a TAB tape carrier. The outer end 16 of each lead 12 is bonded to a contact 18 by any suitable means such as a laser or by a thermocompression or thermosonic bonding tool 22 such as more fully described in U.S. Pat. No. 4,776,509.

The above-described method of attaching an electronic component 12 and electrically connecting it to a support 20 is well known. However, the electronic component 10 may be defective and unless it can be replaced with a new component, an entire multi-chip package or completed assembly must be scrapped. However, in the past, where the bonds between the outer ends 16 of the leads 12 and the contacts 18 were a hard bond, such as a gold plated outer end 16 to a gold plated copper bond pad 18, such bonds were generally considered unrepairable because of the inability of remelting these bonds without damaging the support package or substrate 20. And any attempt to remove the bonds between the leads 12 and the contacts 18 by pulling them loose can result in uneven stub lengths or damage to the bond contact 18.

Figure 2:
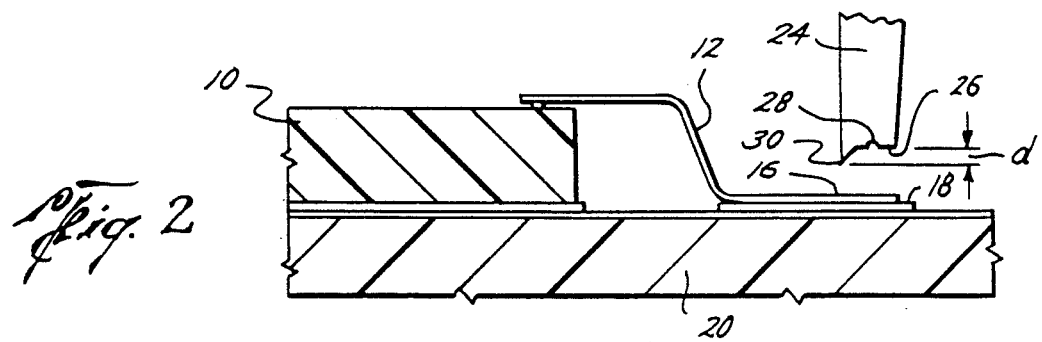
FIG. 2 is a view similar to FIG. 1 illustrating the step of replacing a defective electronic component by cutting an electrical lead adjacent the bond site, but leaving bonded stub.
Figure 3:
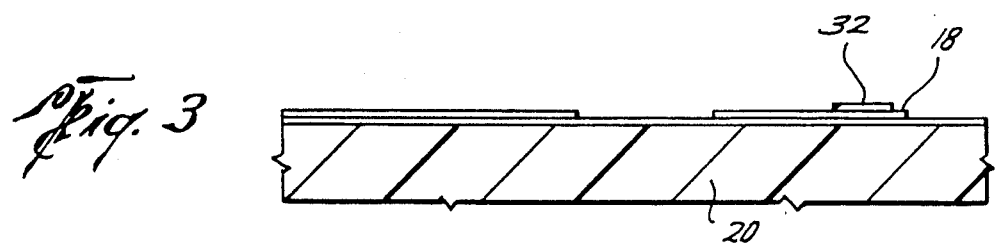
FIG. 3 is a view similar to FIG. 2 in which the defective electronic component and its cut leads have been removed leaving a bonded stub.

Referring now to FIG. 2, a cutting and bonding tool 24 of the present invention is best seen having a flat contacting end 26 with at least one recess 28 therein such as described in U.S. Pat. No. 4,776,509, and including a cutting edge 30 at the outer periphery of the end 26 of the tool 24. The recess 28 is preferred in thermosonic bonding to improve the transfer of ultrasonic energy to the bonding area, but is not an essential element of the present invention. The tool 24 is preferably a computer-controlled single point bonder since the present invention is best suited to cut and rebond one lead at at time. In any case, the tool 24 can be used in place of the bonding tool 22 in a conventional thermocompression or thermosonic bonder. The purpose of the cutting and bonding tool 24 is twofold. First, as best seen in FIGS. 2 and 3, the cutting edge 30 cuts the outer leads 16 of the defective component 10 in front of the original bond site, that is, adjacent the bond between the leads 12 and contacts 18 which were made by the tool 22 as shown in FIG. 1. A preferred material for tool 24 is titanium carbide. As best seen in FIG. 3, cutting the leads 12 leaves a stub 32 bonded to the contact 18 but allows the removal of the defective component 10 and its attached and cut leads 12. As discussed, it is not feasible to remove the stubs 32 because of the inability to remelt the bonds from the contacts 18 or remove the stubs 32 by pulling them from the contacts 18 without damaging the underlying support 20.

Figure 4:
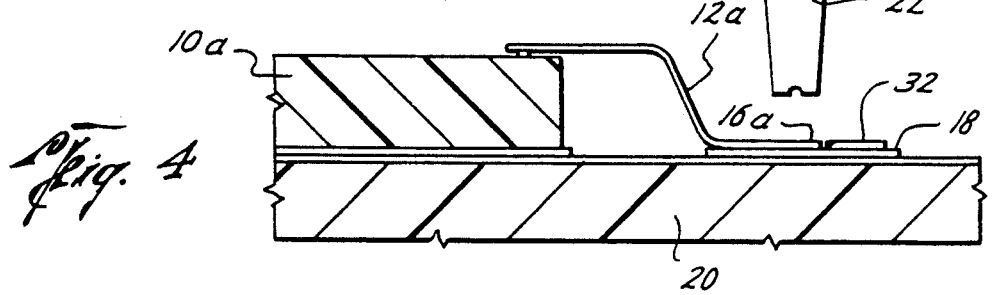
FIG. 4 is a view similar to FIG. 3 in which a replacement electronic component has replaced the defective component and its leads are being bonded adjacent the edge of the stub.
Figure 5:
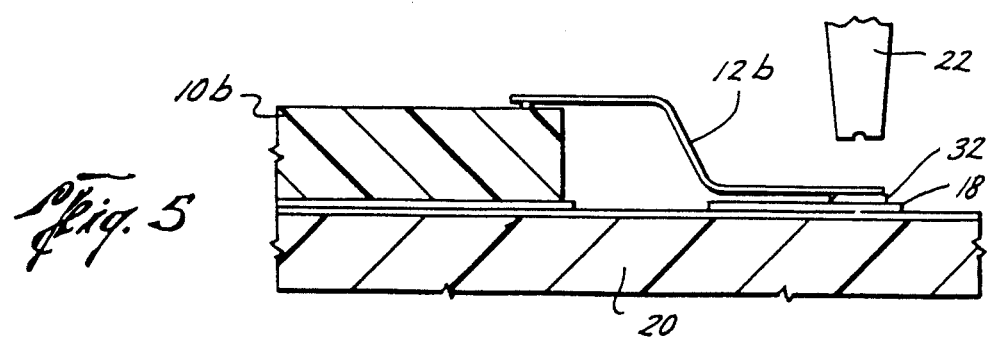
FIG. 5 is a view similar to FIG. 4 showing another method of bonding the leads of the replacement component to the top of the stub.

Therefore, the bonded stubs 32 are allowed to remain in place, as will be more fully described hereinafter, for bonding the leads of a new replacement electronic component to the contacts 18 in front of the stubs 32 (FIG. 4), or, bonding the outer leads of the replacement component on top of the stubs 32 (FIG. 5). However, in either case, the integrity of the bond between the stubs 32 and the contacts 18 must be maintained. That is, even if the new leads 12a are bonded to the contact 18 in front of but not on the stub 32, the stub 32 could possibly become dislodged and short between other electrical members. And, of course, if as in FIG. 5, the electrical leads 12b of the replacement component 10b were bonded on top of the stubs 32, it would be necessary that the stubs 32 be securely bonded to the contacts 18.

Referring again to FIGS. 2 and 3, the cutting and bonding tool 24 of the present invention not only cuts the electrical leads 12 of the defective electronic component 10, but the flat end 26 of the tool 24 also rebonds the stub 32 to the contact 18. This insures that the stub 32 will not become dislodged in the future and also insures that it makes a good electrical bond with the contact 18 if needed for the procedure of FIG. 5.

Therefore, in FIG. 4, each electrical lead 12a of the replacement component 10a may be bonded directly to an electrical contact 18 in front of or adjacent to the stub 32 by any suitable method of bonding such as a laser bonding or the tool 22 used in FIG. 1. Or as an alternative, as best seen in FIG. 5, the replacement component 10b may have each of its outer leads 12b bonded to the top of a stub 32 by any suitable method of bonding such as a laser or the bonding tool 22 previously used. Of course, using the procedure of FIG. 5, the replacement component 10b and its leads 12b may be identical in size to the original component 10 and its leads 12. However, in using the procedure of FIG. 4, it would be necessary that the contacts 18 on the support 18 have a sufficiently large footprint or size in order to provide bonding space on the contact 18 for the outer end 16a of the lead 12a and, if desired, the length of the electrical leads 12a could be shortened. Thus, the procedure of FIG. 4 as compared with that of FIG. 5 will have greater reliability since the original interface between the lead 12 and the contact 18 is eliminated, but will also result in decreased packaging density of components 10 on support 20 due to the space allocated for the footprints.

Referring again to FIG. 2, it is to be noted that the cutting edge 30 extends downwardly from the periphery of the end 26 of the cutting and bonding tool 24 a distance of d. Preferably, the distance of d is a distance less than the thickness of the electrical lead 12. That is, in order to avoid damage to the underlying support 20, the electrical leads 12 are cut substantially, but not entirely through the leads 12. Thereafter, the leads may be easily broken away without damaging the underlying support 20. This is generally accomplished where the extent of the cut can be approximately 90% of the thickness of lead 12. For instance, a cutting edge with a thickness d of 1 mil would be suitable for a lead 12 having a thickness of 1.3 mils.

The flat portion of the end 26 of the tool 24 also helps to control the depth of the cut and prevents the cutting edge from cutting through a lead 12 into the bond pad 18.

The present invention is well suited for cutting and rebonding hard metal bonds; in particular, gold-to-gold bonds such as gold plated copper leads to gold plated copper bond pads.

The present invention, therefore, is well adapted to carry out the objects and attain the ends and advantages mentioned as well as others inherent therein. While presently preferred embodiments of the invention have been given for the purpose of disclosure, numerous changes in the details of construction, arrangement of parts, and steps of the process, may be made without departing from the spirit of the invention and the scope of the appended claims.

What is claimed is:

1. A method of replacing a defective electronic component having a plurality of electrical leads bonded to electrical contacts of a support comprising, cutting the electrical leads adjacent the bonds of the leads to the contacts leaving a stub bonded to each contact, rebonding the stubs to the contacts, replacing the defective component with a replacement electronic component having electrical leads, and bonding the electrical leads of the replacement component to the electrical contacts of the support.

2. The method of claim 1 wherein the step of cutting the leads is performed simultaneously with the step of rebonding the stubs.

3. The method of claim 1 wherein the electrical leads of the replacement component are bonded to the tops of the stubs.

4. The method of claim 1 wherein the electrical leads of the replacement component are bonded to the contacts adjacent the stubs.

5. The method of claim 1 wherein the cutting of the electrical leads is substantially, but not entirely, through the leads for avoiding damaging the support.

6. The method of claim 1 wherein the bond between the electrical leads and the contacts is a gold-to-gold bond.

7. The method of claim 1 wherein the electrical leads are electrical leads of a TAB tape having the outer ends bonded to the contacts.

* * * * *